US012657693B2

(12) United States Patent
Hashizaki et al.

(10) Patent No.: US 12,657,693 B2
(45) Date of Patent: Jun. 16, 2026

(54) SEMICONDUCTOR PRODUCTION APPARATUS SYSTEM

(71) Applicant: KAWASAKI JUKOGYO KABUSHIKI KAISHA, Kobe (JP)

(72) Inventors: Satoshi Hashizaki, Kobe (JP); Shinya Kitano, Kobe (JP); Ryousuke Kanamaru, Kobe (JP); Katsuhiro Yamashita, Kobe (JP); Tomoya Nagasawa, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 18/860,841

(22) PCT Filed: Apr. 24, 2023

(86) PCT No.: PCT/JP2023/016056
§ 371 (c)(1),
(2) Date: Oct. 28, 2024

(87) PCT Pub. No.: WO2023/210560
PCT Pub. Date: Nov. 2, 2023

(65) Prior Publication Data
US 2025/0356478 A1 Nov. 20, 2025

(30) Foreign Application Priority Data
Apr. 27, 2022 (JP) ................................ 2022-073795

(51) Int. Cl.
*G06T 7/00* (2017.01)
*H10P 72/00* (2026.01)
*H10P 72/76* (2026.01)

(52) U.S. Cl.
CPC .......... *G06T 7/001* (2013.01); *H10P 72/0608* (2026.01); *H10P 72/7602* (2026.01); *G06T 2207/30148* (2013.01)

(58) Field of Classification Search
CPC ........... G06T 7/001; G06T 2207/30148; H01L 21/67265; H01L 21/68707
See application file for complete search history.

(56) References Cited

U.S. PATENT DOCUMENTS 6,160,905 A * 12/2000 Ahn ................... G06K 7/10722
382/141
2002/0021435 A1 2/2002 Yamada
(Continued)

FOREIGN PATENT DOCUMENTS

CN 111584392 A * 8/2020 ....... H01L 21/67248
JP 2000-195924 A 7/2000
(Continued)

OTHER PUBLICATIONS

Mar. 31, 2026 Office Action issued in Japanese Patent Application No. 2025-080520.

*Primary Examiner* — Michael Lee
(74) *Attorney, Agent, or Firm* — Oliff PLC

(57) ABSTRACT

A semiconductor production apparatus system includes a substrate-holding hand; an image capturer for capturing an image of at least a component of a semiconductor production apparatus; and a controller for detecting an anomaly of the component of the semiconductor production apparatus based on the captured image captured by the image capturer.

9 Claims, 8 Drawing Sheets

(56)        References Cited

U.S. PATENT DOCUMENTS

| | | | |
|---|---|---|---|
| 2004/0034976 A1 | 2/2004 | Wakizako et al. | |
| 2005/0123386 A1 | 6/2005 | Nishimura et al. | |
| 2014/0174351 A1* | 6/2014 | Aikawa ............. | C23C 16/45551 |
| | | | 118/713 |
| 2020/0027765 A1 | 1/2020 | Goto et al. | |
| 2020/0373179 A1 | 11/2020 | Ayabe | |
| 2021/0407831 A1* | 12/2021 | Sunugatov ............ | H01L 21/681 |

FOREIGN PATENT DOCUMENTS

| | | | | |
|---|---|---|---|---|
| JP | 2001-015575 A | | 1/2001 | |
| JP | 2002-009133 A | | 1/2002 | |
| JP | 2002-224982 A | | 8/2002 | |
| JP | 2004-148447 A | | 5/2004 | |
| JP | 2005-175083 A | | 6/2005 | |
| JP | 2011134822 A | * | 7/2011 | |
| JP | 2013-105948 A | | 5/2013 | |
| JP | 2018-056256 A | | 4/2018 | |
| JP | 2020-191370 A | | 11/2020 | |
| KR | 10-2016-0124965 A | | 10/2016 | |
| WO | WO-2013157462 A1 | * | 10/2013 | ....... H01L 21/67346 |

* cited by examiner

SEMICONDUCTOR PRODUCTION APPARATUS SYSTEM

TECHNICAL FIELD

The present disclosure relates to a semiconductor production apparatus system, and in particular to a semiconductor production apparatus system including a substrate-holding hands.

BACKGROUND ART

Thin-substrate conveyor robots including hands for holding substrates are known in the art. See Japanese Patent Laid-Open Publication No. JP 2002-224982, for example.

The above Japanese Patent Laid-Open Publication No. JP 2002-224982 discloses a thin-substrate conveyor robot for conveying thin-type substrates out of a storage cassette. The thin-substrate conveyor robot includes first and second arms for swinging in a horizontal plane, and a fork attached to the second arm. The fork is a mechanical hand on which thin substrates are placed. The thin-substrate conveyor robot disclosed in the above Japanese Patent Laid-Open Publication No. JP 2002-224982 further includes a camera for detecting a stored state of the thin substrates in the storage cassette to inspect whether the thin substrates are stored in the storage cassette at a correct posture or not.

PRIOR ART

Patent Document

Patent Document 1: Japanese Patent Laid-Open Publication No. JP 2002-224982

SUMMARY OF THE INVENTION

Here, if an anomaly occurs in a storage storing substrates in a semiconductor production apparatus for performing at least one of conveyance of the substrates, application of processing to the substrates and storing the substrates, it becomes difficult to convey the substrates to the storage. Not only in the storage, if an anomaly occurs in the semiconductor production apparatus, it is considered that conveyance of the substrates, application of processing to the substrates and storing the substrates become difficult. However, in the thin-substrate conveyor robot disclosed in the above Japanese Patent Laid-Open Publication No. JP 2002-224982, the camera for detecting the substrates in the storage cassette is not configured to capture images of component of the semiconductor production apparatus, and cannot detect anomalies of the semiconductor production apparatus. From this viewpoint, it is desired to detect anomalies of the semiconductor production apparatus for performing at least one of conveyance of the substrates, application of processing to the substrates and storing the substrates.

The present disclosure is intended to solve the above problem, and one object of the present disclosure is to provide a semiconductor production apparatus system capable of detecting an anomaly of a semiconductor production apparatus for performing at least one of conveying, processing and storing a substrate.

A semiconductor production apparatus system according to an aspect of the present disclosure includes a substrate-holding hand for holding a substrate; an image capturer for capturing an image of at least a component of the semiconductor production apparatus for performing at least one of conveyance of the substrate, application of processing to the substrate and storing the substrate to detect an anomaly of the semiconductor production apparatus; and a controller for detecting the anomaly of the component of the semiconductor production apparatus based on the captured image captured by the image capturer.

In the semiconductor production apparatus system according to the aspect of the present disclosure, as discussed above, an image capturer for capturing an image of at least a component of the semiconductor production apparatus for performing at least one of conveyance of the substrate, application of processing to the substrate and storing the substrate to detect an anomaly of the semiconductor production apparatus, and a controller for detecting the anomaly of the component of the semiconductor production apparatus based on the captured image captured by the image capturer are provided. Accordingly, a captured image used to detect an anomaly of the semiconductor production apparatus can be acquired by capturing the image of at least the component of the semiconductor production apparatus to detect the anomaly of the semiconductor production apparatus. Consequently, it is possible to detect an anomaly of the semiconductor production apparatus for performing at least one of conveyance of the substrate, application of processing to the substrate and storing the substrate based on the captured image acquired.

According to the present disclosure, it is possible to detect an anomaly of a semiconductor production apparatus performing at least one of conveyance of a substrate, application of processing to a substrate and storing a substrate.

MODES FOR CARRYING OUT THE INVENTION

The following description will describe embodiments embodying the present disclosure with reference to the drawings.

First Embodiment

The following description describes a configuration of a substrate processing system 100 according to a first embodiment with reference to FIGS. 1 to 10. The substrate processing system 100 is an example of a semiconductor production apparatus system.

Figure 1:
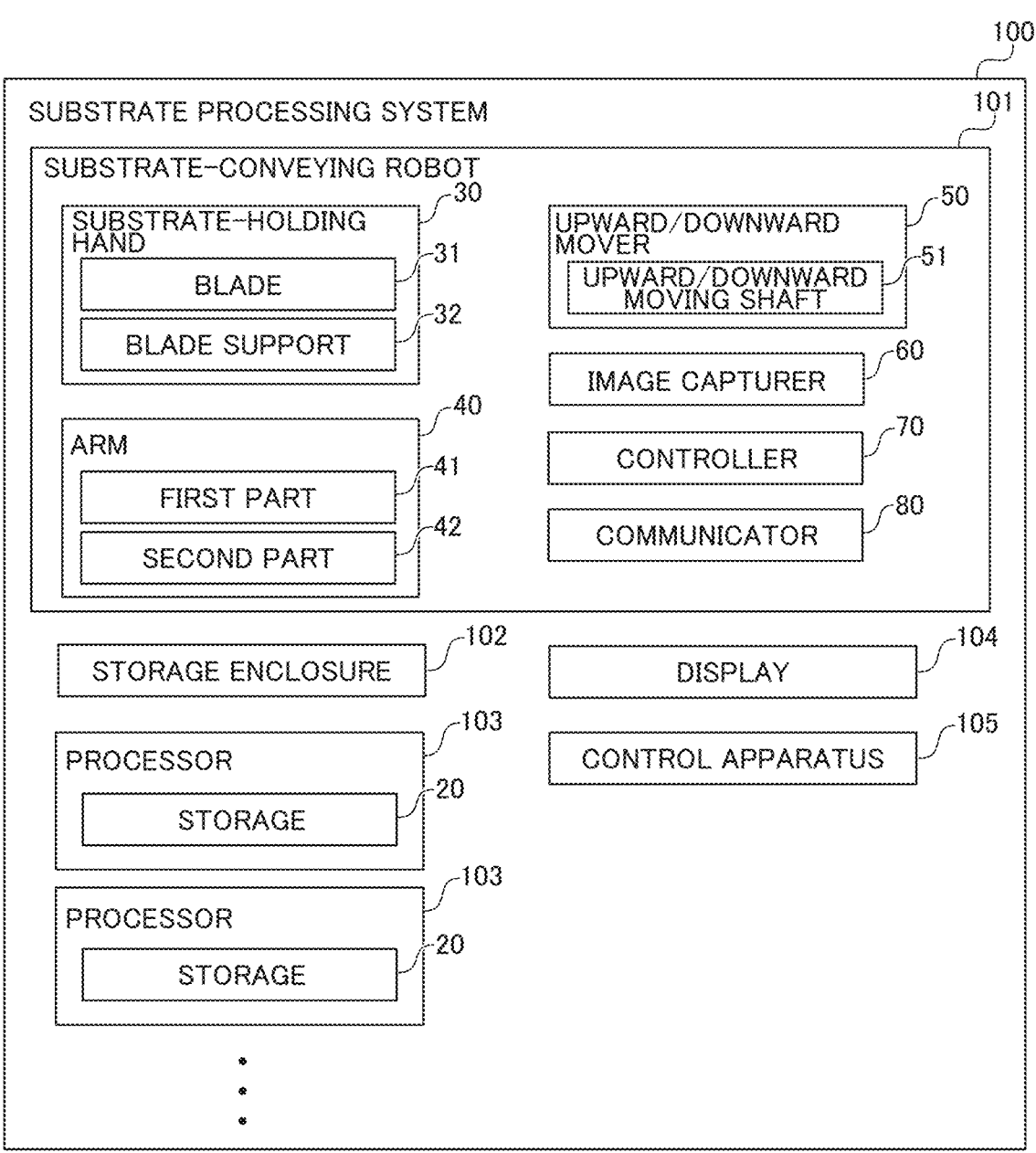
FIG. 1 is a block diagram showing an entire configuration of a substrate processing system according to a first embodiment.

As shown in FIG. 1, the substrate processing system 100 includes a substrate-conveying robot 101, a storage enclosure 102, a plurality of processors 103, a display 104, and a control apparatus 105. The substrate processing system 100 applies processing to a substrate 10, such as a semiconductor wafer or printed circuit board, for example. The substrate processing system 100 processes a plurality of substrates 10 stored in the storage enclosure 102. The storage enclosure 102 may also store the substrates 10 to which processing has been applied. The substrate 10 has a roughly disk shape, for example, and is arranged adjacent to each other in a vertical direction and stored in the storage enclosure 102. The processor 103 applies processing, such as resist coating or etching, to the substrates 10, for example. The storage enclosure 102 is an example of a semiconductor production apparatus and an example of a storage. The processor 103 is an example of the semiconductor production apparatus.

The display 104 indicates information on a status of the substrate processing system 100. Specifically, the display 104 indicates information indicating operating statuses of the plurality of processors 103 and an operating status of the substrate-conveying robot 101. The display 104 includes, for example, a liquid crystal display. The control apparatus 105 is a higher-level controller that controls the entire substrate processing system 100. The control apparatus 105 outputs signals for operating the plurality of processors 103 and the substrate-conveying robot 101. The control apparatus 105 is a computer including a CPU (Central Processing Unit), a RAM (Random Access Memory), a ROM (Read Only Memory), and the like.

Figure 2:
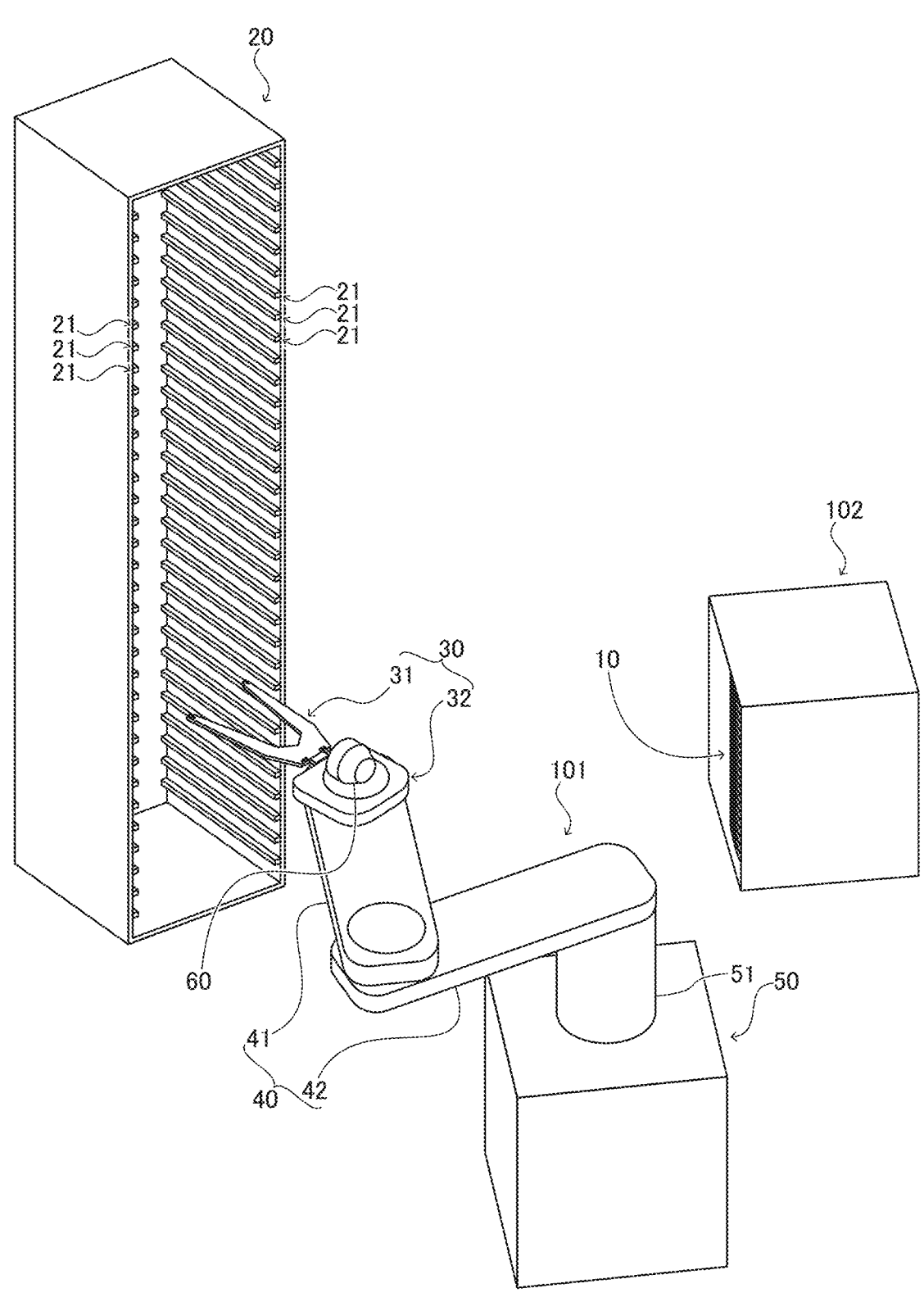
FIG. 2 is a schematic diagram showing configurations of a substrate-conveying robot, a storage enclosure, and a storage of a processor according to the first embodiment.

As shown in FIG. 2, the substrate-conveying robot 101 is a robot for conveying the substrate 10. The substrate-conveying robot 101 performs at least one of conveying the substrates 10 out of the processors 103 that apply processing to the substrates 10 and conveying the substrates 10 into the processors 103. The substrate-conveying robot 101 performs at least one of conveying the substrates 10 out of the storage enclosure 102 for storing the substrates 10 and conveying the substrates 10 into the storage enclosure 102. The processors 103 includes storages 20 for storing a plurality of substrates 10. For example, the substrate-conveying robot 101 conveys the substrates 10 that are stored in the storage enclosure 102 to the storage 20 in one of the plurality of processors 103. Subsequently, the substrate-conveying robot 101 conveys the substrates 10 that have been processed in one of the processors 103 from the storage 20 in the one processor 103 to the storage 20 in another of the plurality of processors 103. Here, the storage 20 is an example of a component of the semiconductor production apparatus.

Figure 3:
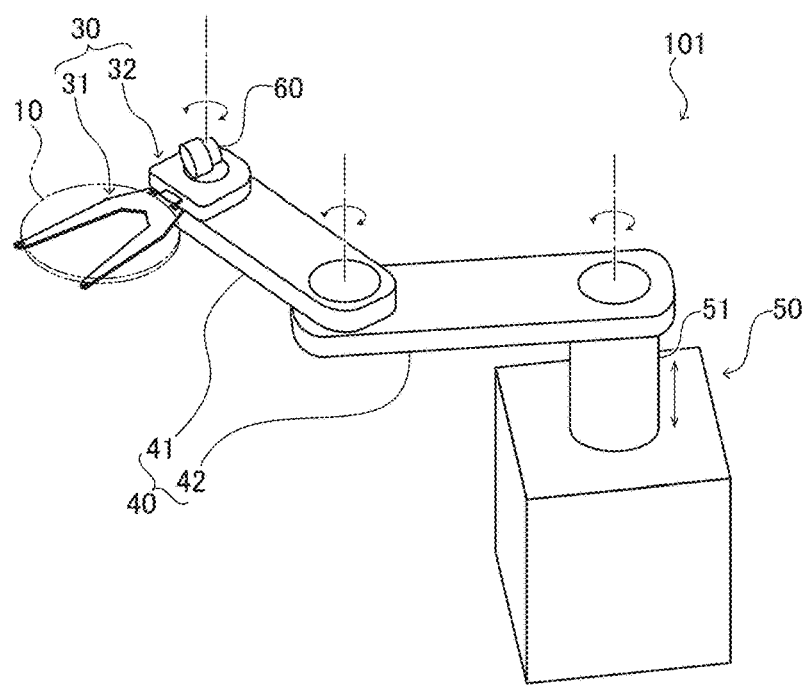
FIG. 3 is a perspective view illustrating an arm and an upward/downward mover.

As shown in FIG. 3, the substrate-conveying robot 101 includes a substrate-holding hand 30, an arm 40, and an upward/downward mover 50. The substrate-holding hand 30 includes a blade 31 and a blade support 32. The arm 40 and upward/downward mover 50 forms a moving mechanism that moves the substrate-holding hand 30 to convey the substrate 10.

The substrate 10 is placed on the blade 31. Specifically, the blade 31 is a thin plate-shaped support for supporting the substrate 10. The blade 31 has bifurcated distal ends. The blade 31 supports a back surface of an outer edge of the substrate 10, which has the roughly disk shape, from a lower side in the vertical direction. One substrate 10 is placed on the blade 31. The blade support 32 supports the blade 31. Specifically, the blade support 32 supports a proximal end of the blade 31.

The arm 40 is a horizontal multi-joint robot arm. In other words, the substrate-conveying robot 101 is a horizontal multi-joint robot. The substrate-holding hand 30 is attached to a distal end of the arm 40. The blade support 32 of the substrate-holding hand 30 is rotatably connected to the arm 40 in a horizontal direction. The arm 40 includes two links that are a first part 41 and a second part 42. The first part 41 and the second part 42 are rotatably connected to each other in the horizontal direction. The first part 41 of the arm 40 includes one end connected to the substrate-holding hand 30, and another one end connected to the second part 42.

The arm 40 is connected to the upward/downward mover 50. Specifically, the second part 42 of the arm 40 includes one end connected to the first part 41, and another one end rotatably connected to an upward/downward moving shaft 51 of the upward/downward mover 50 in the horizontal direction. The upward/downward mover 50 moves the arm 40 upward/downward by moving the upward/downward moving shaft 51 in the vertical direction. The upward/downward moving shaft 51 is arranged in the upward/downward mover 50 to extend in the vertical direction. The upward/downward mover 50 moves the substrate-holding hand 30 upward/downward by moving the arm 40 upward/downward.

The arm 40 and the upward/downward mover 50 include servo motors as drive sources. Also, the arm 40 and the upward/downward mover 50 include rotational position sensors, such as encoders, that detect rotational positions of output shafts of the servomotors. The arm 40 and the upward/downward mover 50 are operated by control process by using a controller 70, which will be described later.

The substrate-conveying robot 101 includes an image capturer 60. The image capturer 60 is arranged in the blade support 32. Specifically, the image capturer 60 is arranged on an upper side of the blade support 32 in the vertical direction. In other words, the image capturer 60 is arranged on the upper side with respect to the blade 31 in the vertical direction. Also, the image capturer 60 is arranged on the upper side with respect to a placement surface on which the substrate 10 is placed in the blade 31. The image capturer 60 is moved together with the blade support 32. In other words, the image capturer 60 is moved together with the blade support 32 by operation of the arm 40 and the upward/downward mover 50.

Figure 4:
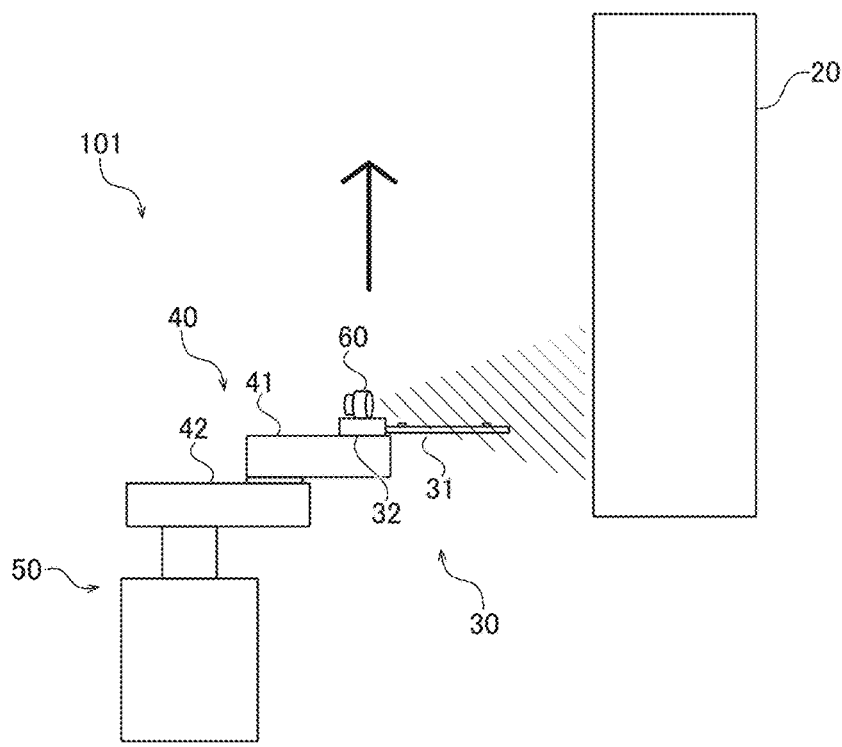
FIG. 4 is a side view to illustrating capture of an image of the storage by using an image capturer.

As shown in FIG. 4, in the first embodiment, the image capturer 60 captures an image of the component of at least the storage enclosure 102 and the processor 103 to detect an anomaly of the storage enclosure 102 and the processor 103. The component of the storage enclosure 102 is, for example, a protrusion on which the substrate 10 is placed in the storage enclosure 102. The component of the processor 103 is equipment, such as the storage 20, and a consumable in the processor 103. The captured image P captured by the image capturer 60 is output to the controller 70. The image capturer 60 includes a two-dimensional camera such as a CCD (Charge Coupled Device) image sensor or CMOS (Complementary Metal Oxide Semiconductor) image sensor, including a plurality of imaging elements, for example. The image capturer 60 may include a three-dimensional camera.

As shown in FIG. 1, the substrate-conveying robot 101 includes the controller 70 and a communicator 80. The controller 70 controls operations of the substrate-conveying robot 101. The controller 70 is, for example, a computer including a CPU, RAM, ROM, and the like. The controller 70 includes a storage device that includes a flash memory, such as an SSD (Solid State Drive). The controller 70 controls the operations of the parts of the substrate-conveying robot 101 based on programs and parameters previously stored in the storage device.

The communicator 80 communicates with the plurality of processors 103. The communicator 80 also communicates with the higher-level control apparatus 105. The communicator 80 includes a communication module for communication through LAN (Local Area Network) and the like. In other words, the controller 70 communicates with the outside of the substrate-conveying robot 101 through the communicator 80.

Detection of Anomaly

The following description describes detection of an anomaly of a component of the storage enclosure 102 or the processor 103 detected by the controller 70 with reference to FIGS. 4 to 10.

In the first embodiment, the controller 70 detects an anomaly of the component of the storage enclosure 102 or the processor 103 based on the captured image P captured by the image capturer 60. In other words, the controller 70 performs detection of an anomaly in a component such as a part included in the storage enclosure 102 and a component such as equipment forming the processor 103 by applying image analysis processing to the captured image P captured by the image capturer 60.

The controller 70 captures images by using the image capturer 60 at a predetermined interval. The controller 70 captures a predefined number of images of a plurality of to-be-imaged targets that are previously set in maintenance that is periodically conducted at a predetermined interval, such as once a day, for example. In the maintenance process, the controller 70 captures images of a plurality of components of the storage enclosure 102 and the processor 103 as inspection targets while change a position of the image capturer 60 by operating the arm 40 and the upward/downward mover 50. Even in a case in which an inspection target is not positioned in a conveyance path of the substrate 10, the controller 70 controls operations of the arm 40 and the upward/downward mover 50 to move the blade support 32 so as to position the image capturer 60 at a position for capturing an image of the inspection target.

As shown in FIG. 4, for example, the image capturer 60 captures an image of the storage 20, which is a component of the processor 103, based on control by the controller 70. Subsequently, the controller 70 detects an anomaly of the storage 20. When detecting an anomaly of the storage 20, the controller 70 first captures an image of the entire storage 20. In a case in which size of the storage 20 in the vertical direction is larger than a field of view of the image capturer 60, the controller 70 moves the image capturer 60 in the vertical direction by operating the upward/downward mover 50 and captures a plurality of images by using the image capturer 60.

Figure 5:
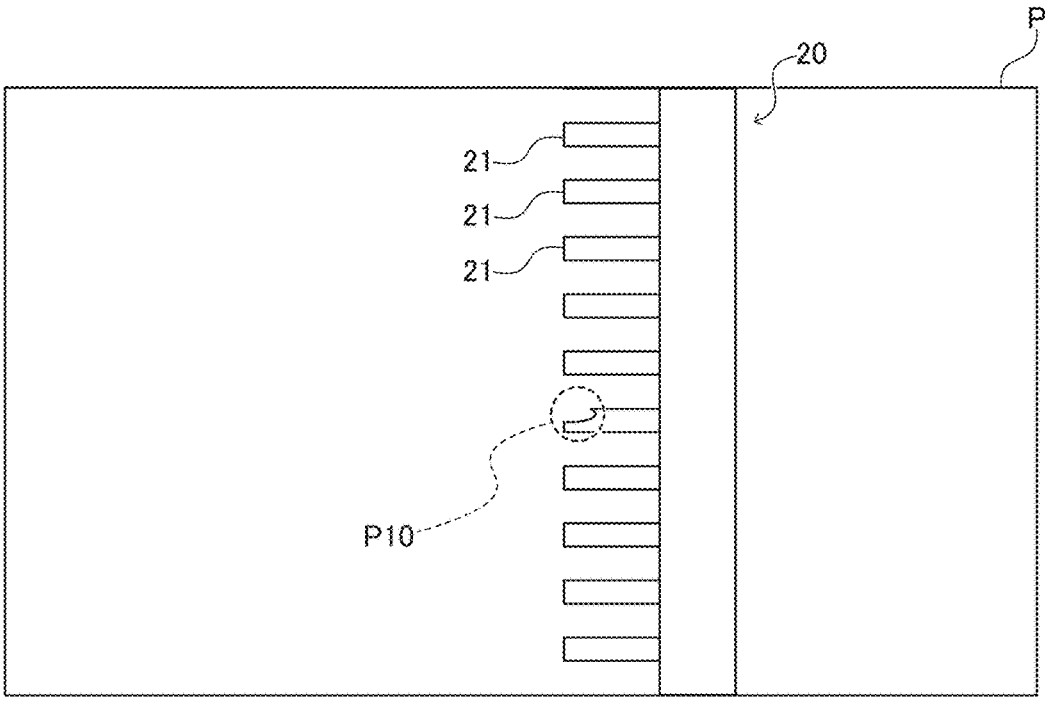
FIG. 5 is a view showing an exemplary captured image.

As shown in FIG. 5, the controller 70 detects an anomalous shape change of the component of the storage enclosure 102 or the processor 103 based on the captured image P. For example, the controller 70 detects the anomalous shape change in the storage 20 by performing image analysis based on the captured image P of the storage 20 captured.

The storage 20 of the processor 103 includes a plurality of substrate placement parts 21 on which substrates 10 are placed. The substrate placement parts 21 protrude in the horizontal direction so that the substrate 10 is placed on the substrate placement parts. In the storage 20, the plurality of substrates 10 are arranged adjacent to each other in the vertical direction with being spaced at a predetermined interval away from each other.

Here, the substrate placement parts 21 of the storage 20 deteriorate with repeated use. Specifically, as shown in a part P10 in FIG. 5, an anomaly such as chipping or cracking occurs in the substrate placement part 21 in some cases. In such a case, an anomaly such as misalignment in the substrate 10 stored in the storage 20 occurs.

Figure 6:
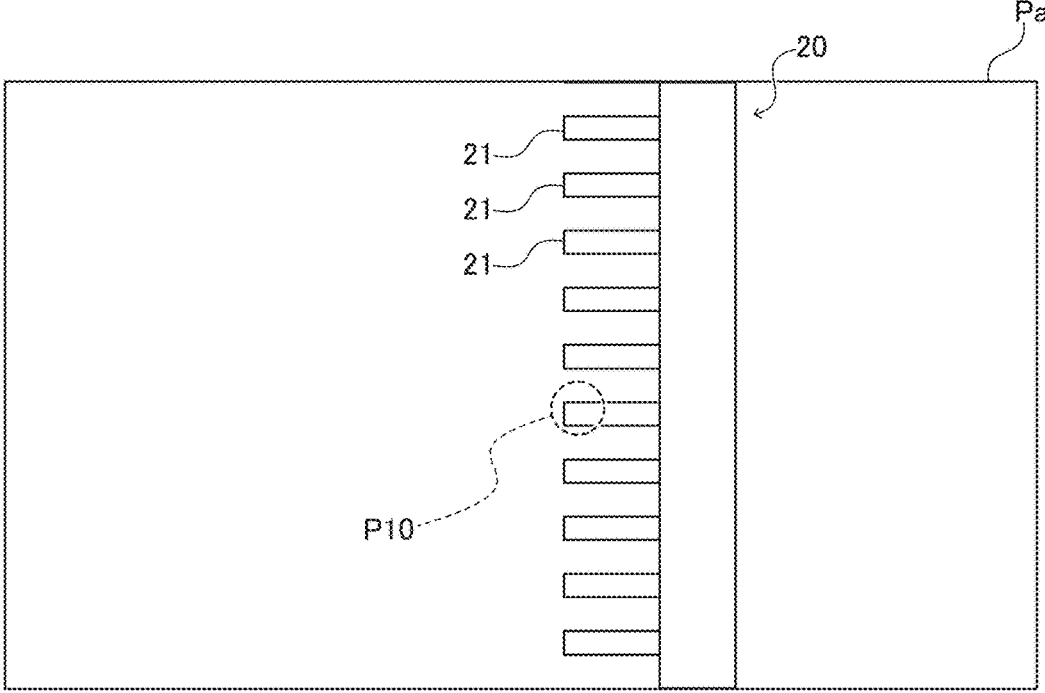
FIG. 6 is a view showing an exemplary reference image.

To address this, the controller 70 detects the anomaly in the component of the processor 103 by comparing a reference image Pa, which is previously set, with the captured image P captured by the image capturer 60, as shown in FIG. 6. To detect the anomaly of the substrate placement part 21, the image capturer 60 captures an image of the substrate placement parts 21 with no substrate 10 being placed on the substrate placement parts. In other words, the captured image P and the reference image Pa of the substrate placement parts 21 are captured with no substrate 10 being placed on the substrate placement parts. The reference image Pa is captured by the image capturer 60, and is stored in the storage device by the controller 70 every when the storage 20 is replaced, for example. The reference image Pa may be a captured image P captured in previous maintenance. The controller 70 detects an anomalous area in the captured image P by performing pattern matching processing using the reference image Pa as a template, for example. The controller 70 detects the anomaly of the substrate placement parts 21 with no substrate 10 being placed based on the captured image P of the substrate placement parts 21 with no substrate 10 being placed. In the reference image Pa in FIG. 6, the anomaly of chipping in the part P10 in the captured image P of FIG. 5 does not occur. The controller 70 stores position coordinates of the image capturer 60 at the time of capturing the reference image Pa by storing the control amounts of the arm 40 and the upward/downward mover 50 at the time of capturing the reference image Pa in association with the reference image Pa. Subsequently, when detecting the anomaly, the controller 70 captures the captured image P with the image capturer 60 being moved to the same position coordinates as those of the reference image Pa, and compares the reference image Pa and the captured image P whose image capturer 60 position coordinates are the same as each other to detect the area whose shape changes from a shape of the reference image Pa as the anomaly of a shape change in the component of the processor 103.

Figure 7:
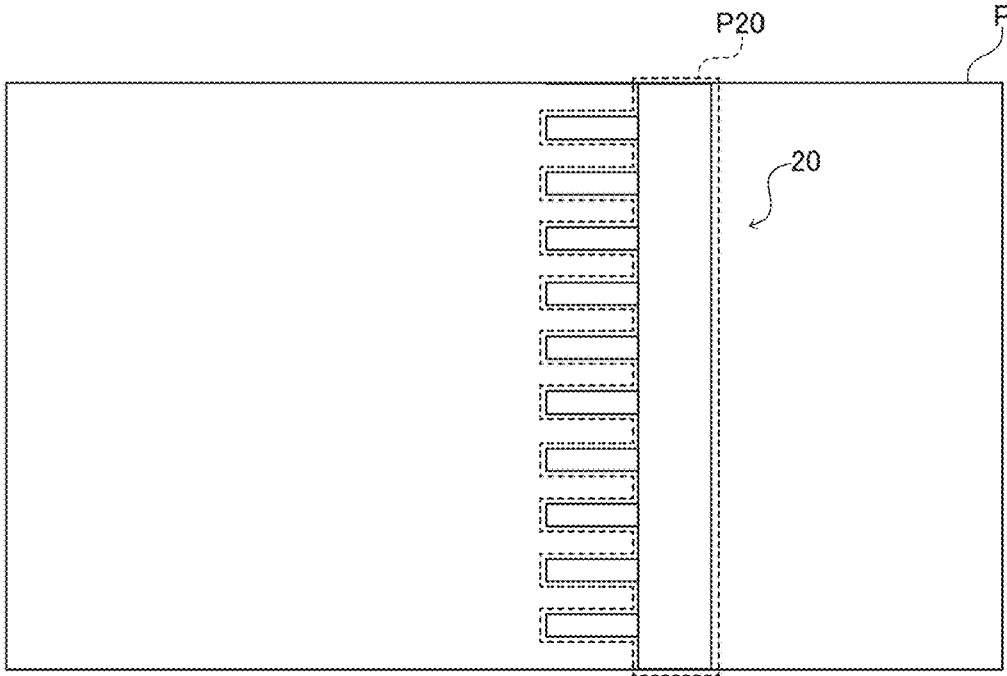
FIG. 7 is a view illustrating detection of misalignment based on the captured image.

As shown in FIG. 7, the anomaly of misalignment occurs in the component of the storage enclosure 102 or the processor 103 in some cases. For example, the anomaly of misalignment may occur in the storage 20. If the anomaly of misalignment occurs in the storage 20, the substrate 10 cannot be properly stored. As shown in a part P20 in FIG. 7, the controller 70 detects the anomaly of misalignment in the storage 20 based on the captured image P. Specifically, similar to the detection of the anomaly of the shape change, the controller 70 detects the anomaly of misalignment in the storage 20 by comparing the previously set reference image Pa and the captured image P. In other words, the controller 70 detects the anomaly of misalignment in the storage 20 if when a position of the storage 20 changes from a position of the storage 20 at the time of capturing the reference image Pa.

Figure 8:
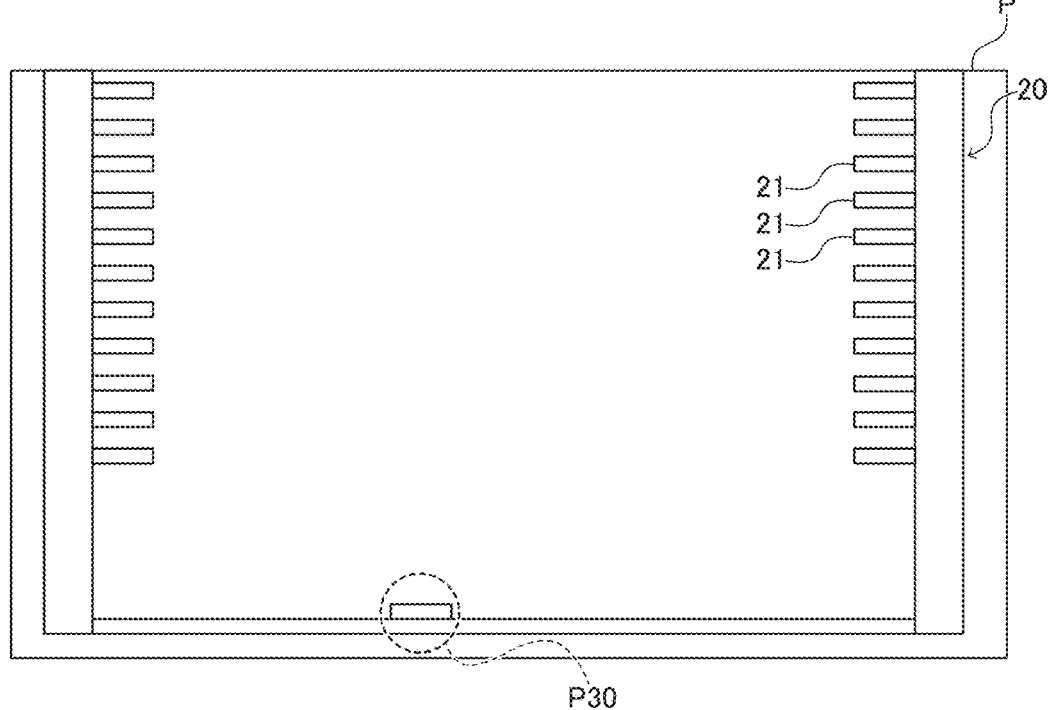
FIG. 8 is a view illustrating detection of a foreign matter based on the captured images.

As shown in FIG. 8, an anomaly as detection of a foreign matter occurs in the component of the storage enclosure 102 or the processor 103 in some cases. For example, a chipped piece of the substrate placement part 21 may become a foreign matter in the storage 20. As shown in a part P30 in FIG. 8, the controller 70 detects the foreign matter as an anomaly based on the captured image P. Specifically, similar to the anomalies of the shape change and the misalignment, the controller 70 detects the foreign matter by comparing the previously set reference image Pa and the captured image P.

Here, when capturing an image of the component of the processor 103 to detect an anomaly, the controller 70 brings the image capturer 60 in proximity to the inspection target. In other words, the blade support 32 is brought in proximity to the inspection target so that the image capturer 60 is brought in proximity to the component of the processor 103 that is the inspection target.

When an anomaly is detected in a component of the storage enclosure 102 or the processor 103 that is the inspection target, the controller 70 outputs an anomaly detection signal indicating that the anomaly of the component of the storage enclosure 102 or the processor 103 is detected. Subsequently, if the controller 70 detects the anomaly of the component of the storage enclosure 102 or the processor 103, the communicator 80 outputs the anomaly detection signal to the outside of the substrate-conveying robot 101. For example, the controller 70 outputs the anomaly detection signal to the higher-level control apparatus 105 through the communicator 80. Here, the controller 70 may output the anomaly detection signal to the processor 103.

Figure 9:
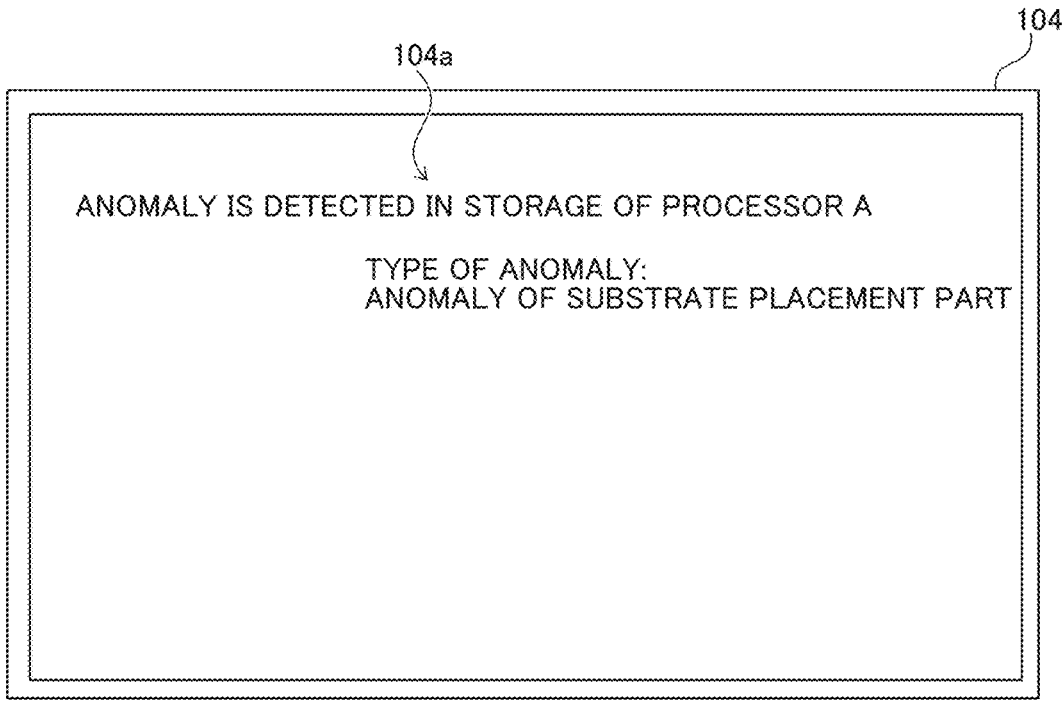
FIG. 9 is a view illustrating an exemplary indication on a display if an anomaly is detected.

As shown in FIG. 9, for example, the control apparatus 105 indicates an anomaly detection indication 104a, which indicates that the anomaly is detected, on the display 104 of the substrate processing system 100 in response to the anomaly detection signal output from the controller 70. FIG. 9 is a view illustrating an exemplary indication when an anomaly of the storage 20 is detected in one of the plurality of processors 103. The anomaly detection indication 104a includes an indication of a type of the anomaly detected. The substrate processing system 100 may also stop the operations of the substrate-conveying robot 101 and the processor 103 when the anomaly detection signal is output. Also, the controller 70 may store the captured image P in which the anomaly is detected in the storage device. In this case, a plurality of captured images P that include the captured image P in which the anomaly is detected may be stored as video.

Figure 10:
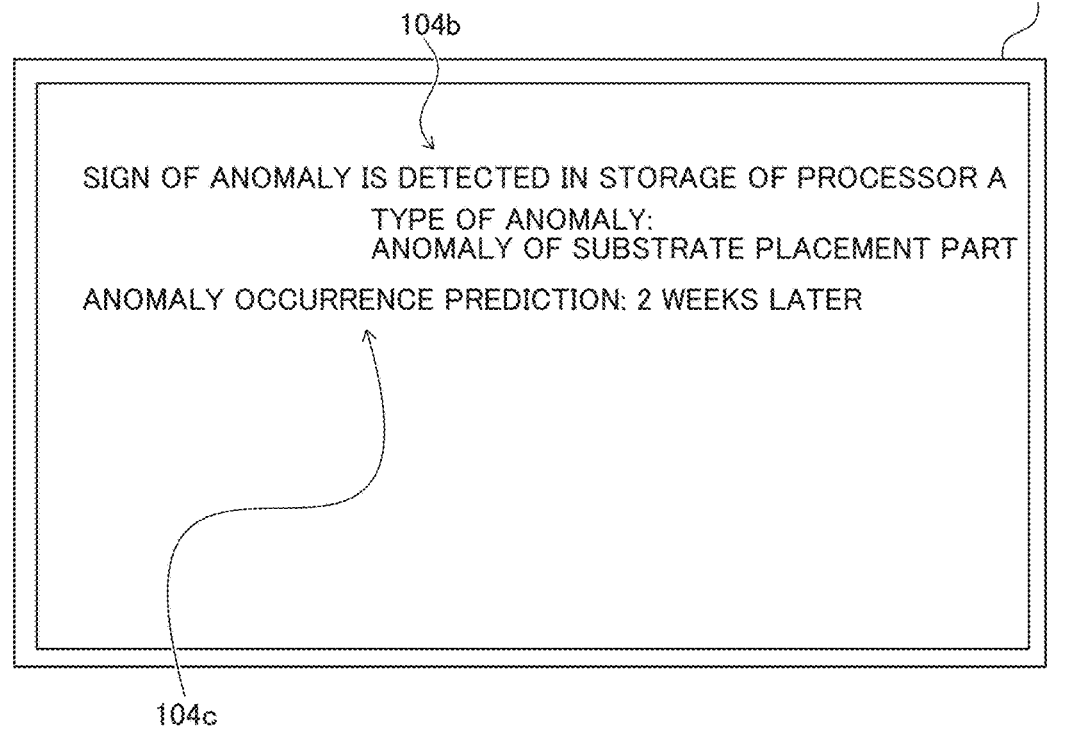
FIG. 10 is a view illustrating an exemplary indication on the display if a predicted anomaly is detected.

As shown in FIG. 10, the controller 70 detects a sign of an anomaly in the component of the storage enclosure 102 or the processor 103 based on the captured image P. In other words, the controller 70 detects the anomaly that is expected to occur in the component of the storage enclosure 102 or the processor 103. Specifically, the controller 70 detects the sign of the anomaly by comparing the reference image Pa with the captured image P. For example, the substrate placement parts 21 of the storage 20 gradually wear with repeated use in some cases. Accordingly, shape changes of the substrate placement parts 21 are gradually advanced in such a case. When detecting an anomaly of a shape change of each substrate placement part 21 by comparing the reference image Pa with the captured image P, the controller 70 detects a degree of the shape change and also detects a sign of the anomaly based on a degree of the shape change. For example, the controller 70 detects a relatively small degree of the shape change as the sign of the anomaly. The controller 70 outputs an anomaly sign detection signal indicating that the sign of the anomaly is detected to the higher-level control apparatus 105 through the communicator 80. The control apparatus 105 indicates an anomaly sign detection indication 104b, which indicates that the sign of the anomaly is detected, on the display 104 of the substrate processing system 100 in response to the anomaly sign detection signal output from the controller 70. FIG. 10 is a view illustrating an exemplary indication when a sign of an anomaly in the storage 20, which is expected to occur, is detected in one of the plurality of processors 103. The anomaly sign detection indication 104b includes an indication of a type of the sign of the anomaly detected. Also, the control apparatus 105 directs the display 104 of the substrate processing system 100 to indicate a lifetime indication 104c indicating timing of when the anomaly is expected to occur based on the anomaly sign detection signal output from the controller 70. When detecting the sign of the anomaly, the controller 70 predicts a period of time until the anomaly will occur. In other words, when detecting the sign of the anomaly, the controller 70 predicts a lifetime of the component in which the sign of the anomaly is detected. In the lifetime indication 104c, the predicted timing includes date, elapsed time, and number of uses. For example, the controller 70 compares the reference image Pa with the captured image P to predict the period of time until the anomaly will occur based on a degree of comparison. Subsequently, the controller 70 outputs the anomaly sign detection signal including information indicating the lifetime, which is the predicted timing, based on the predicted period of time until the anomaly will occur. The controller 70 detects anomalies and signs of anomalies based on, for example, threshold values stored in the storage device in advance.

Anomaly Detection Method

Figure 11:
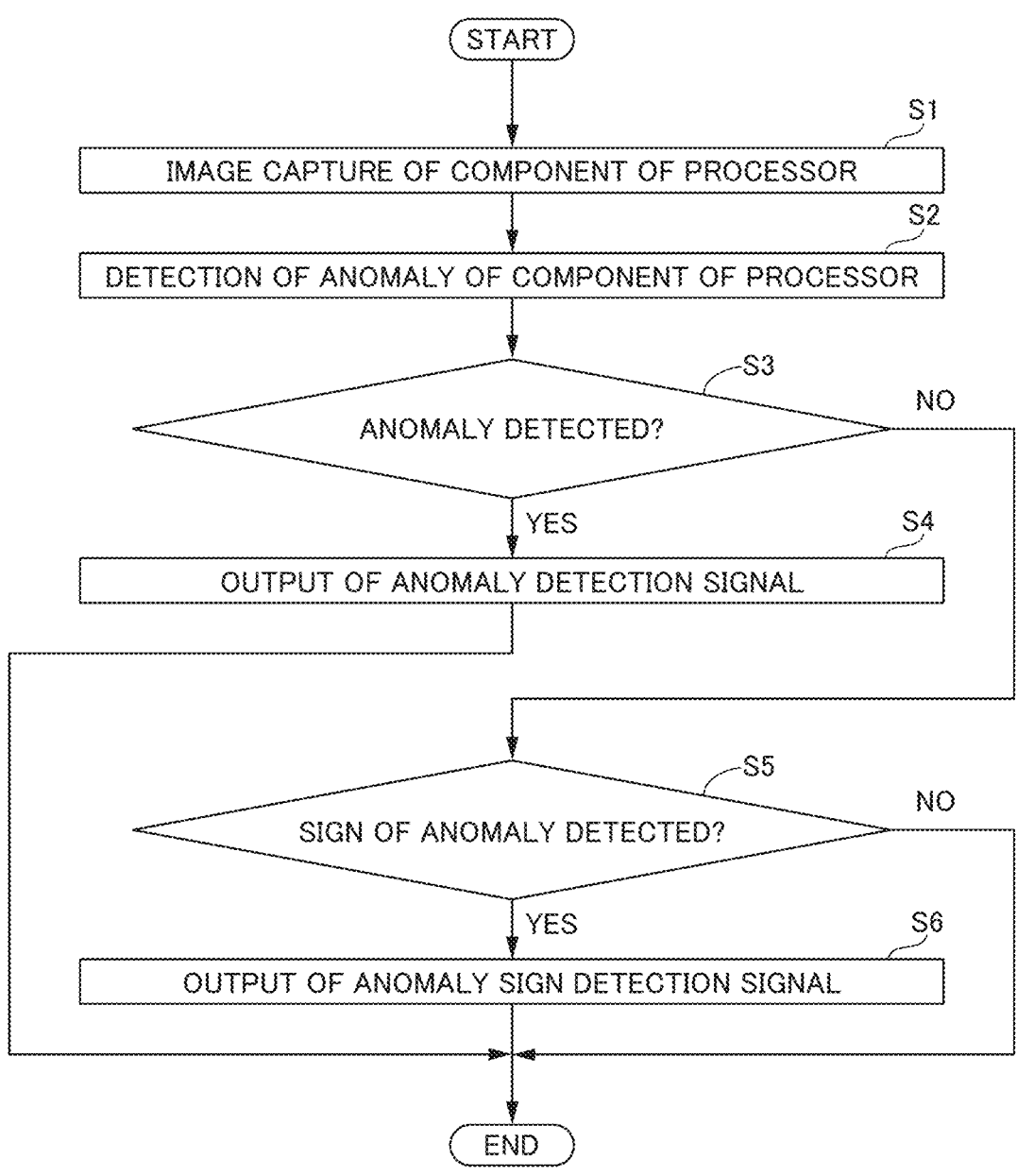
FIG. 11 is a flowchart illustrating an anomaly detection method according to the first embodiment.

The following description describes a method for detecting an anomaly of the processor 103 with reference to FIG. 11. For example, processing for controlling the method for detecting the anomaly is periodically executed in the maintenance at a predetermined interval, such as once a day, as described above. The processing for controlling the method for detecting the anomaly is executed by the controller 70. Here, the method for detecting the anomaly is similar to a method for detecting an anomaly of the semiconductor production apparatus such as the storage enclosure 102 other than processor 103.

First, in step S1, an image of at least a component of the processor 103 is captured by the image capturer 60 to detect the anomaly of the processor 103. For example, an image of the storage 20 is captured without no substrate 10 being stored in the storage 20. In a case in which a plurality of storages 20 are included in processors 103, an image of each of the plurality of storages 20 is captured. Images of the storages 20 of the plurality of processors 103 are captured one by one. A captured image P is acquired by capturing an image of the component by using the image capturer 60.

Subsequently, in step S2, the anomaly of the component of the processor 103 is detected based on the captured image P. Specifically, the anomaly of the component of the processor 103 is detected by comparing a reference image Pa, which is previously set, with the captured image P, which is acquired in step S1. Here, in a case in which the plurality of components of the processor 103 are included as inspection targets, a plurality of types of reference images Pa are previously set and stored corresponding to the plurality of inspection targets.

Subsequently, in step S3, it is determined whether the anomaly is detected in the component of the processor 103. If the anomaly is detected in the component of the processor 103, the procedure goes to step S4. If the anomaly is not detected in the inspection target, the procedure goes to step S5.

In step S4, based on the detected anomaly, an anomaly detection signal indicating that the anomaly is detected is output. The anomaly detection signal is transmitted to the higher-level control apparatus 105 of the substrate processing system 100 through the communicator 80, for example. Subsequently, the anomaly detection indication 104a indicating that the anomaly is detected is indicated on the display 104 by the control apparatus 105.

In step S5, it is determined based on the captured image P whether a sign of an anomaly that is expected to occur in the component of the processor 103 is detected. If the sign of the anomaly is detected, the procedure goes to step S6. If the sign of the anomaly is not detected, the processing for controlling the method for detecting the anomaly ends.

In step S6, the anomaly sign detection signal indicating that the sign of the anomaly is detected is output. The anomaly sign detection signal is transmitted to the higher-level control apparatus 105 of the substrate processing system 100 through the communicator 80, for example. Subsequently, the anomaly sign detection indication 104b indicating that the sign of the anomaly predicted is detected and the lifetime indication 104c are indicated on the display 104 by the control apparatus 105.

Advantages of First Embodiment

In the first embodiment, the following advantages are obtained.

The substrate processing system 100 includes the image capturer 60 for capturing an image of at least a component of the storage enclosure 102 or the processor 103 for performing at least one of conveyance of the substrate 10, application of processing to the substrate and storing the substrate to detect an anomaly in the storage enclosure 102 or the processor 103; and a controller 70 for detecting the anomaly of the component of the storage enclosure 102 or the processor 103 based on the captured image P captured by the image capturer 60. Accordingly, the captured image P used to detect an anomaly of the storage enclosure 102 or the processor 103 can be acquired by capturing the image of at least the component of the storage enclosure 102 or the processor 103 to detect the anomaly of the storage enclosure 102 or the processor 103. Consequently, it is possible to detect an anomaly of the semiconductor production apparatus for performing at least one of conveyance of the substrate 10, application of processing to the substrate 10 and storing the substrate 10 based on the captured image P acquired.

The controller 70 detects an anomaly including at least one of shape change of the component of the storage enclosure 102 or the processor 103, misalignment of the component of the storage enclosure 102 or the processor 103, and detection of a foreign matter based on the captured image P. Accordingly, it is possible to detect an anomaly including at least one of shape change of the component of the storage enclosure 102 or the processor 103, misalignment of the component, and detection of a foreign matter. Consequently, it is possible to prevent an anomaly from occurring in the conveyance or processing of the substrate 10 due to at least one of the shape change, the misalignment of the component, and the foreign matter.

The substrate-holding hand 30 includes the blade 31 on which the substrate 10 is placed and the blade support 32 for supporting the blade 31, and the image capturer 60 is arranged in the blade support 32. Accordingly, since the image capturer 60 is arranged in the blade support 32 of the substrate-holding hand 30 for holding the substrate 10, the image capturer 60 can be moved by a configuration for moving the substrate-holding hand 30 for conveying the substrate 10. As a result, in a case in which a plurality of components of the storage enclosure 102 and the processor 103 that are inspection targets are included, or in a case in which a component of the storage enclosure 102 or the processor 103 that is an inspection target is larger than a field of view of the image capturer 60, the image capturer 60 can be moved by the configuration for moving the substrate-holding hand 30. Consequently, it is possible to prevent an apparatus configuration from becoming complicated dissimilar to a case in which a configuration that moves only the image capturer 60 is separate provided. Also, since the image capturer 60 is arranged not in the blade 31 on which the substrate 10 is placed but in the blade support 32 for supporting the blade 31, it is possible to prevent physical interference of the image capturer 60 with the substrate 10 when the substrate 10 is placed on the blade 31.

The image capturer 60 captures an image of the component of the processor 103, which is the storage 20 for storing the substrate 10 in the processor 103, and the controller 70 detects an anomaly of the storage 20 based on the captured image P. Accordingly, it is possible to detect the anomaly in the storage 20. Consequently, it is possible to prevent an anomaly from occurring in the conveyance of the substrate 10 to the processor 103 due to the anomaly of the storage 20.

The storage 20 includes the substrate placement part 21 on which the substrate 10 is placed; the image capturer 60 captures an image of the substrate placement part 21 without the substrate 10 being placed; and the controller 70 detects an anomaly in the substrate placement part 21 without the substrate 10 being placed based on the captured image P. Here, in a case in which an anomaly occurs in the substrate placement part 21 of the storage 20, it is difficult to accurately store the substrate 10 in the storage 20. In such a case, it can be considered that an anomaly will occur in processing applied to the substrate 10 by the processor 103. To address this, in the first embodiment, the image capturer 60 captures an image of the substrate placement part 21 without the substrate 10 being placed, and the controller 70 detects an anomaly in the substrate placement part 21 without the substrate 10 being placed based on the captured image P. Accordingly, since an anomaly of the substrate placement part 21 can be detected, it is possible to effectively prevent an anomaly from occurring in the conveyance of the substrate 10 to the processor 103 or in the processing applied to the substrate 10 by the processor 103. Also, dissimilar to a case in which an image of the substrate placement part 21 is captured with the substrate 10 being placed on the substrate placement part, since an image of the substrate placement part 21 is captured without the substrate 10 being placed on the substrate placement part, it is possible to prevent that the substrate placement part 21 is hidden by the substrate 10 in the captured image P. Consequently, it is possible to more accurately detect an anomaly of the substrate placement part 21.

The controller 70 detects an anomaly of the component of the storage enclosure 102 or the processor 103 by comparing the previously set reference image Pa with the captured image P captured by the image capturer 60. Accordingly, an area in the captured image P that is different from the reference image Pa can be easily detected by comparing the reference image Pa with the captured image P. Consequently, the area in the captured image P that is different from the reference image Pa can be easily detected as an anomaly.

The substrate processing system 100 includes the communicator 80 that outputs an anomaly detection signal indicating that an anomaly is detected in the component of the storage enclosure 102 or the processor 103 when the controller 70 detects an anomaly of a component of the storage enclosure 102 or the processor 103. Accordingly, an informer, such as the display 104, which is different from the controller 70, can inform operators that the anomaly is detected. Consequently, since the operators can easily recognize that the anomaly has occurred, they can prevent that the storage enclosure 102 or processor 103 is used with the anomaly being occurring.

The controller 70 detects a sign of an anomaly in a component of the storage enclosure 102 or the processor 103, and predicts a period of time until the anomaly will occur based on the captured image P. Accordingly, since the sign of the anomaly can be detected, it is possible to carry out measures against the sign of the anomaly of the component such as to repair or replace the component in a time period out of usage of the storage enclosure 102 or the processor 103 before occurrence of an anomaly that causes the storage enclosure 102 or the processor 103 to necessarily stop its usage. Consequently, it is possible to prevent occurrence of the anomaly in usage of the storage enclosure 102 or the processor 103, it is possible to prevent stoppage of at least one of conveyance of the substrate 10, application of processing to the substrate 10 and storing the substrate 10. As a result, it is possible to prevent increase of time required for at least one of conveyance of the substrate 10, application of processing to the substrate 10 and storing the substrate 10.

The controller 70 detects an anomaly of a component of the storage enclosure 102 or the processor 103 based on the captured images P that are captured at a predetermined interval. Accordingly, since the anomaly of the component of the storage enclosure 102 or the processor 103 can be periodically detected at the predetermined interval, it is possible to effectively prevent that the storage enclosure 102 or processor 103 is used with the anomaly being occurring.

Second Embodiment

Figure 12:
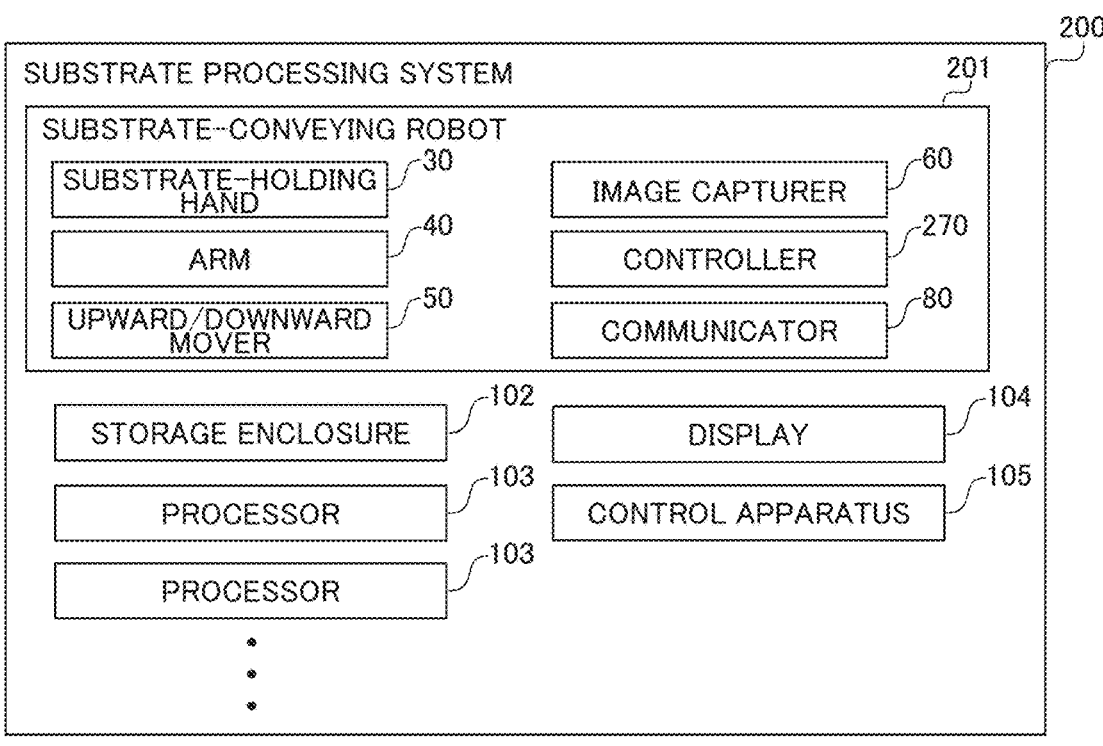
FIG. 12 is a block diagram showing an entire configuration of a substrate processing system according to a second embodiment.
Figure 13:
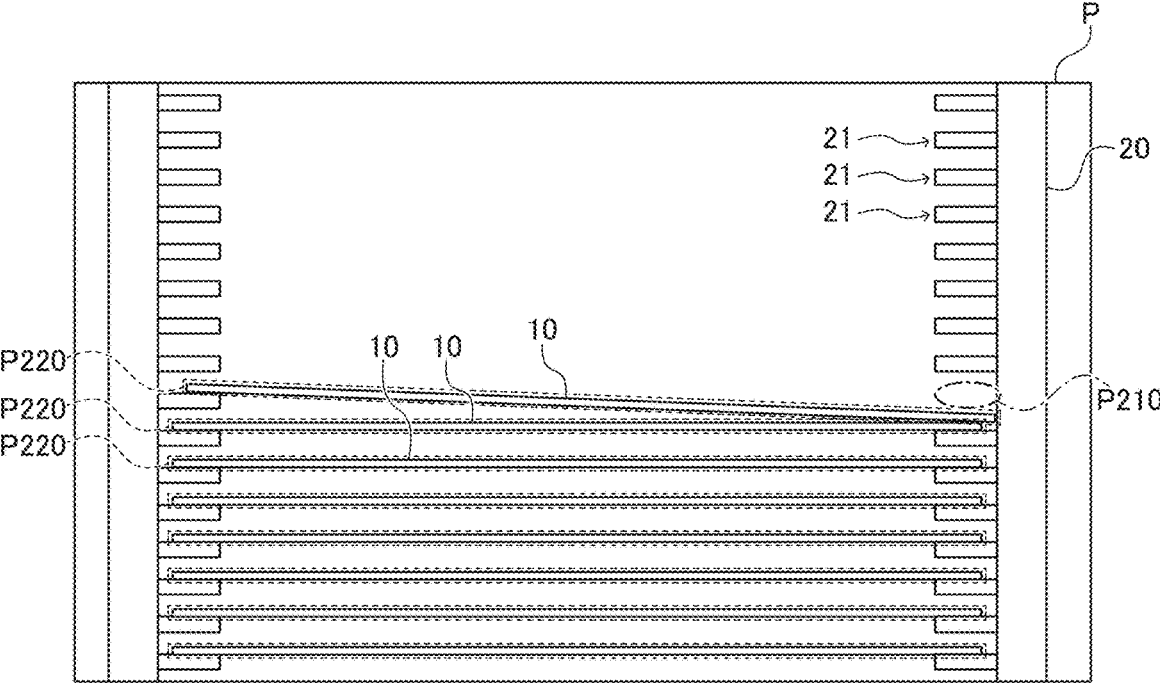
FIG. 13 is a schematic view showing an exemplary captured image in the second embodiment.

The following description describes a configuration of a substrate processing system 200 according to a second embodiment of the present disclosure with reference to FIGS. 12 and 13. In this second embodiment, when an anomaly of the storage 20 is detected, a state of the substrate 10 is detected. The same components as those of the first embodiment are denoted by the same reference numerals, and their description is omitted.

As shown in FIG. 12, the substrate processing system 200 according to the second embodiment includes a substrate-conveying robot 201. Also, the substrate-conveying robot 201 includes a controller 270. The controller 270 has a hardware configuration similar to the controller 70 according to the first embodiment. In other words, the substrate-conveying robot 201 has a hardware configuration similar to the substrate-conveying robot 101 according to the first embodiment. The substrate processing system 200 is an example of a semiconductor production apparatus system.

Similar to the controller 70 according to the first embodiment, the controller 270 detects an anomaly of a component of the storage enclosure 102 or the processor 103 based on a captured image P captured by the image capturer 60. For example, similar to the first embodiment, the controller 270 detects an anomaly of the storage 20, which is a component of the processor 103, by comparing the previously set reference image Pa with the captured image P of the storage 20 captured.

As shown in FIG. 13, in the second embodiment, the controller 270 detects the state of the substrate 10 stored in the storage 20 based on the captured image P if the anomaly of the storage 20 is detected.

For example, in a case in which the substrates 10 are conveyed one by one from the storage enclosure 102 to the storage 20 of the processor 103, the controller 270 detects the anomaly of the storage 20 to which each substrate is conveyed. The controller 270 detects an anomaly of the substrate placement parts 21 of the storage 20 to which the substrates are conveyed every when each substrate is conveyed or every when a predetermined number of substrates 10 are conveyed. In this case, a captured image P that is captured at one anomaly detection operation previous to the current anomaly detection operation may be used in each anomaly detection operation as the reference image Pa. If detecting an anomaly in the storage 20 during conveyance of the substrate 10, the controller 270 outputs an anomaly detection signal similar to the first embodiment. A part P210 shown by a single-dotted line in FIG. 13 illustrates an anomaly of one of the substrate placement parts 21 of the storage 20 that is missing.

The controller 270 detects the state of the substrates 10 that have been stored in the storage 20 when detecting the anomaly of the storage 20. Parts P220 shown by the dotted lines in FIG. 13 illustrate detection of the substrates 10 in the storage 20. The controller 270 detects storage states including placement positions and shapes of the substrates 10 as the states of the substrates 10 stored in the storage 20 when detecting the anomaly of the storage 20.

The controller 270 moves the substrate-holding hand 30 based on the detected states of the substrates 10 by operating the arm 40 and the upward/downward mover 50 to convey the substrate 10 stored in the storage 20 out of the storage 20. For example, in a case in which one of the substrate placement parts 21 is missing, the substrate 10 is stored in a tilted state as shown in FIG. 13. In other words, the anomaly of the storage 20 may make the storage state of the one substrate 10 different from a normal storage state. The controller 270 conveys the substrate 10 that is not in the normal storage state out of the storage 20 by moving the substrate-holding hand 30 based on the detected states of the substrates 10. In other words, the controller 270 retrieves the substrates 10 whose storage state is detected as an anomalous state from the storage 20 by detecting the state of the substrate 10. The controller 270 conveys the substrate 10 out of the storage by moving the substrate-holding hand 30 based on the detected states of the substrates 10 while preventing interference of the substrate-holding hand with the substrate 10. After leaving out the substrate 10 whose storage state is anomalous, the controller 270 may continue the conveyance operation of the substrate 10 while avoiding the part of the storage 20 that is detected as anomalous, or may stop the conveyance operation of the substrate 10. Even when detecting an anomaly of the storage 20, the controller 270 continues to convey the substrates 10 if the states of the substrates 10 are normal. In other words, even when an anomaly of the storage 20 is detected, the processor 103 applies processing to the substrates 10 if the states of the substrates 10 are normal.

The other configuration of the second embodiment is similar to the first embodiment.

Advantages of Second Embodiment

In the second embodiment, the following advantages are obtained.

The controller 270 detects a state of the substrate 10 stored in the storage 20 based on a captured image P if an anomaly of the storage 20 is detected. Here, the anomaly of the storage 20 may make the state of the substrate 10 stored in the storage 20 different from a normal state. To address this, in the second embodiment, the controller detects the state of the substrate 10 stored in the storage 20 based on the captured image P if the anomaly of the storage 20 is detected, and as a result it is possible to convey the substrate 10 that is stored with being tilted from its normal state or two substrates 10 that are stored with one of the two substrates being stacked on another out of the storage 20, for example. Also, it is possible to confirm whether any of the substrate 10 stored in the storage 20 is brought in an anomalous state if the anomaly of the storage 20 is detected. Consequently, even when the anomaly is detected in the storage 20, since processing in the processor 103 can continue if the states of the substrates 10 are normal, it is possible to prevent the processing applied to the substrate 10 from being interrupted. The other advantages of the second embodiment are similar to the first embodiment.

Modified Embodiments

Note that the embodiment disclosed this time must be considered as illustrative in all points and not restrictive. The scope of the present disclosure is not shown by the above description of the embodiments but by the scope of claims for patent, and all modifications (modified embodiments) within the meaning and scope equivalent to the scope of claims for patent are further included.

While the example in which an anomaly including at least one of shape change of the component of the storage enclosure 102 or the processor 103, misalignment of the component of the storage enclosure 102 or the processor 103, and detection of a foreign matter is detected based on the captured image P has been shown in the aforementioned first and second embodiments, the present disclosure is not limited to this. In the present disclosure, consumption of a consumable such as an electrode or solution used for processing in the processor may be detected as the anomaly.

While the example in which the image capturer 60 is arranged in the blade support 32 of the substrate-holding hand 30 has been shown in the aforementioned first and second embodiments, the present disclosure is not limited to this. In the present disclosure, the image capturer may be arranged in the arm for moving the substrate-holding hand. Also, the image capturer may be arranged in the base to which the arm is connected.

While the example in which the image capturer 60 is arranged on an upper side of the blade support 32 in the substrate-holding hand 30 in the vertical direction has been shown in the aforementioned first and second embodiments, the present disclosure is not limited to this. In the present disclosure, the image capturer may be arranged on a lateral side of the blade support. Also, the image capturer may be arranged on a lower side of the blade support.

While the example in which an anomaly of the storage 20 is detected as detection of an anomaly in a component of the processor 103 has been shown in the aforementioned first and second embodiments, the present disclosure is not limited to this. In the present disclosure, an anomaly in a component such as equipment of the processor other than the storage may be detected. Also, not an anomaly of a component of the processor but an anomaly of a component of the storage enclosure for storing the substrates may be detected. Also, an anomaly of a component of a conveyor apparatus for conveying the substrates may be detected.

While the example in which the anomaly in the substrate placement part 21 without the substrate 10 being placed is detected by capturing an image of the substrate placement part 21 without the substrate 10 being placed has been shown in the aforementioned first embodiment, the present disclosure is not limited to this. In the present disclosure, the anomaly in the substrate placement part with the substrate being placed may be detected by capturing an image of the substrate placement part with the substrate being placed. In other words, an anomaly in the storage may be detected with the substrate being stored. For example, when a substrate is conveyed from the storage enclosure to the storage of the processor, an anomaly in the storage enclosure may be detected with the substrate being stored before conveyed.

While the example in which a state of the substrate 10 stored in the storage 20 is detected based on a captured image P if an anomaly of the storage 20 is detected has been shown in the aforementioned second embodiment, the present disclosure is not limited to this. In the present disclosure, an anomaly only of the component of the semiconductor production apparatus may be detected without detecting the state of the substrate.

While the example in which an anomaly of the component of the storage enclosure 102 or the processor 103 is detected by comparing the previously set reference image Pa with the captured image P has been shown in the aforementioned first and second embodiments, the present disclosure is not limited to this. In the present disclosure, an anomaly of the component of the semiconductor production apparatus may be detected based on previously set parameters and based on the captured image without using the reference image.

While the example in which the communicator 80 for outputting an anomaly detection signal is provided has been shown in the aforementioned first and second embodiments, the present disclosure is not limited to this. In the present disclosure, no communicator may be provided.

While the example in which an anomaly of a component of the processor 103 is detected based on the captured images P that are captured at a predetermined interval has been shown in the aforementioned first and second embodiments, the present disclosure is not limited to this. In the present disclosure, captured images may be captured in response input operations by operators, and an anomaly may be detected based on the captured images. Also, the predetermined interval may be once a week, once a month, or the like, instead of once a day. Also, captured images P that are captured at the predetermined interval may be captured not at a predetermined period of time but at a predetermined number of processing operations or a predetermined number of conveyance operations. Also, a captured image may be captured at activation of the substrate processing system, and an anomaly may be detected based on the captured image.

While the example in which one blade 31 is supported by the blade support 32 has been shown in the aforementioned first and second embodiments, the present disclosure is not limited to this. In the present disclosure, the blade support may support a plurality of blades.

While the example in which one substrate-holding hand 30 is provided to the arm 40 has been shown in the aforementioned first and second embodiments, the present disclosure is not limited to this. In the present disclosure, a plurality of substrate-holding hands may be provided. In this configuration, the image capturer may be arranged in at least one of the plurality of substrate-holding hands. Also, in the configuration in which the plurality of substrate-holding hands are provided, image capturers may be arranged in some of the plurality of substrate-holding hands. In other words, a plurality of blade supports may be provided.

While the example in which the controller 70 for controlling operations of the substrate-conveying robot 101 executing detection of an anomaly based on the captured image P has been shown in the aforementioned first embodiment, the present disclosure is not limited to this. In the present disclosure, the substrate-conveying robot may directly output the captured image that has been captured without executing detection of an anomaly. In this configuration, the communicator of the substrate-conveying robot outputs not an anomaly detection signal indicating that an anomaly is detected but the captured image captured by the image capturer. In other words, a controller separate from the controller that controls the operations of the substrate-holding hand may execute detection of an anomaly of a component of the processor based on the captured image. For example, processing for controlling detection of anomaly may be executed in the higher-level control apparatus of the substrate processing system. Alternatively, a remote control system that is provided separately from the substrate processing system may execute detection of an anomaly of a component of the processor based on the captured image. In other words, the substrate processing system and the remote control system may be included in the semiconductor production apparatus system in the present disclosure.

Although the example in which an anomaly detection signal indicating that an anomaly is detected is output when the anomaly is detected has been shown in the aforementioned first and second embodiments, the anomaly may be removed in the present disclosure. For example, the substrate-conveying robot may replace or repair a component that is detected as anomalous. Also, the substrate-conveying robot may add a consumable. Also, the substrate-conveying robot may remove a foreign matter detected.

The functions of the elements disclosed herein can be performed using circuits, including general-purpose processors, dedicated processors, integrated circuits, Application Specific Integrated Circuits (ASICs), conventional circuits, and/or combinations thereof, configured or programmed to perform the disclosed functions, circuitry or processing circuits, including general-purpose processors, dedicated processors, integrated circuits, ASICs (Application Specific Integrated Circuits), conventional circuits, and/or combinations thereof. A processor is considered a processing circuit or circuits because it contains transistors and other circuitry. In the present disclosure, a circuit, unit, or means is hardware that performs an enumerated function or is hardware programmed to perform an enumerated function. The hardware may be the hardware disclosed herein or any other known hardware that is programmed or configured to perform the enumerated functions. If the hardware is a processor, which is considered a type of circuit, the circuit, means, or unit is a combination of hardware and software, and software is used to configure the hardware and/or processor.

MODES

It is understood by those skilled in the art that the exemplary embodiments described above are specific examples of the following aspects.

Mode Item 1

A semiconductor production apparatus system includes a substrate-holding hand for holding a substrate; an image capturer for capturing an image of at least a component of a semiconductor production apparatus for performing at least one of conveyance of the substrate, application of processing to the substrate and storing the substrate to detect an anomaly of the semiconductor production apparatus; and a controller for detecting the anomaly of the component of the semiconductor production apparatus based on the captured image captured by the image capturer.

Mode Item 2

In the semiconductor production apparatus system according to mode item 1, the controller detects the anomaly including at least one of shape change of the component of the semiconductor production apparatus, misalignment of the component of the semiconductor production apparatus, and detection of a foreign matter based on the captured image.

Mode Item 3

In the semiconductor production apparatus system according to mode item 1 or 2, the substrate-holding hand includes a blade on which the substrate is placed and a blade support supporting the blade; and the image capturer is arranged in the blade support.

Mode Item 4

In the semiconductor production apparatus system according to any of mode items 1 to 3, the image capturer captures the image of the component of the semiconductor production apparatus that is a storage for storing the substrate in the semiconductor production apparatus; and the controller detects the anomaly of the storage based on the captured image.

Mode Item 5

In the semiconductor production apparatus system according to mode item 4, the storage includes a substrate placement part on which the substrate is placed; and the image capturer captures the image of the substrate placement part with no substrate being placed; and the controller detects the anomaly in the substrate placement part with no substrate being placed based on the captured image.

Mode Item 6

In the semiconductor production apparatus system according to mode item 4, the controller detects a state of the substrate that is stored in the storage based on the captured image if the anomaly of the storage is detected.

Mode Item 7

In the semiconductor production apparatus system according to any of mode items 1 to 6, the controller detects the anomaly of the component of the semiconductor production apparatus by comparing a previously set reference image with the captured image captured by the image capturer.

Mode Item 8

In the semiconductor production apparatus system according to any of mode items 1 to 7, a communicator for outputting an anomaly detection signal indicating that the anomaly of the component of the semiconductor production apparatus is detected if the anomaly of the component of the semiconductor production apparatus is detected by the controller is further provided.

Mode Item 9

In the semiconductor production apparatus system according to any of mode items 1 to 8, the controller detects a sign of the anomaly in the component of the semiconductor production apparatus and predicts a period of time until the anomaly will occur based on the captured image.

Mode Item 10

In the semiconductor production apparatus system according to any of mode items 1 to 9, the controller detects the anomaly of the component of the semiconductor production apparatus based on captured images that are captured at a predetermined interval.

The invention claimed is:

1. A semiconductor production apparatus system comprising:
   a substrate-holding hand configured to hold a substrate;
   an image capturer configured to capture an image of at least a component of a semiconductor production apparatus for performing at least one of conveyance of the substrate, application of processing to the substrate and storing the substrate to detect an anomaly of the semiconductor production apparatus; and
   a controller configured to detect the anomaly of the component of the semiconductor production apparatus based on the captured image captured by the image capturer,
   wherein the controller is configured to detect a sign of the anomaly in the component of the semiconductor production apparatus and predict a period of time until the anomaly will occur based on the captured image.

2. The semiconductor production apparatus system according to claim 1, wherein the controller is configured to detect the anomaly including at least one of shape change of the component of the semiconductor production apparatus, misalignment of the component of the semiconductor production apparatus, and detection of a foreign matter based on the captured image.

3. The semiconductor production apparatus system according to claim 1, wherein
   the substrate-holding hand includes a blade on which the substrate is placed and a blade support supporting the blade; and
   the image capturer is arranged in the blade support.

4. The semiconductor production apparatus system according to claim 1, wherein
   the image capturer is configured to capture the image of the component of the semiconductor production apparatus that is a storage for storing the substrate in the semiconductor production apparatus; and
   the controller is configured to detect the anomaly of the storage based on the captured image.

5. The semiconductor production apparatus system according to claim 4, wherein
   the storage includes a substrate placement part on which the substrate is placed; and
   the image capturer is configured to capture the image of the substrate placement part with no substrate being placed; and
   the controller is configured to detect the anomaly in the substrate placement part with no substrate being placed based on the captured image.

6. The semiconductor production apparatus system according to claim 4, wherein
   the controller is configured to detect a state of the substrate that is stored in the storage based on the captured image if the anomaly of the storage is detected.

7. The semiconductor production apparatus system according to claim 1, wherein the controller is configured to detect the anomaly of the component of the semiconductor production apparatus by comparing a previously set reference image with the captured image captured by the image capturer.

8. The semiconductor production apparatus system according to claim 1 further comprising a communicator configured to output an anomaly detection signal indicating that the anomaly of the component of the semiconductor production apparatus is detected if the anomaly of the component of the semiconductor production apparatus is detected by the controller.

9. The semiconductor production apparatus system according to claim 1, wherein the controller is configured to detect the anomaly of the component of the semiconductor production apparatus based on captured images that are captured at a predetermined interval.

* * * * *